Jan. 18, 1966 H. BRETT ET AL 3,230,466

PHASE-SHIFT AMPLIFIER WITH CYCLOTRON WAVE MODULATION OF PUMP ENERGY

Filed May 26, 1964

INVENTORS,
HERBERT BRETT
HEINRICH G. KOSMAHL

BY: Harry M. Saragovitz, Edward J. Kelly, Herbert Berl & Julian C. Keppler

ATTORNEYS

United States Patent Office 3,230,466

Patented Jan. 18, 1966

3,230,466

PHASE-SHIFT AMPLIFIER WITH CYCLOTRON WAVE MODULATION OF PUMP ENERGY

Herbert Brett, Fair Haven, N.J., and Heinrich G. Kosmahl, Olmsted Falls, Ohio, assignors to the United States of America as represented by the Secretary of the Army Filed May 26, 1964, Ser. No. 370,382
9 Claims. (Cl. 330—10)
(Granted under Title 35, U.S. Code (1952), sec. 266)

Figure 1:
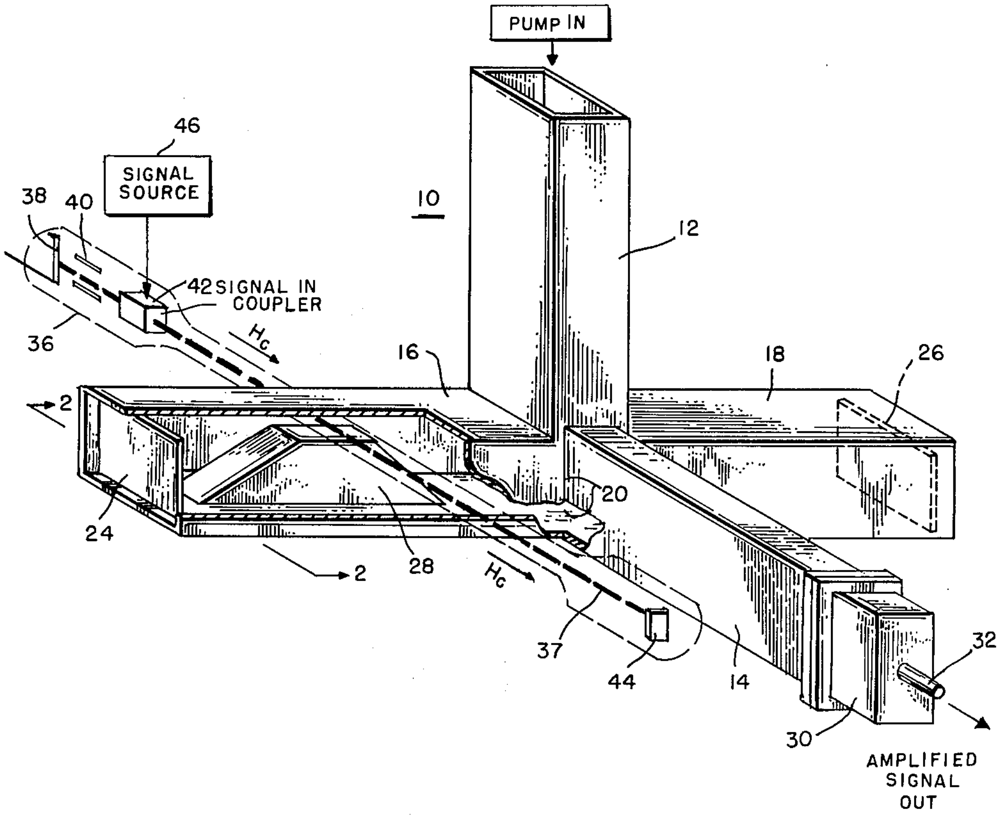

The invention described herein may be manufactured and used by or for the Government for governmental purposes without the payment of any royalty thereon.

This invention relates to microwave amplifiers and more particularly to an improved standing wave or phase-shift amplifier utilizing electron beams.

The term phase-shift amplification relates to amplifying devices in which the flow of power from a source to a load is controlled by a non-linear reactance element. The operation of phase-shift amplification depends upon mixing in non-linear reactance elements and a basic property of such mixing is that power gain results when conversion is made from a lower frequency to a higher frequency. Of course, the term "amplification" implies power gain at the input frequency so that when achieving amplification by mixing one must up-convert and down-convert simultaneously. Since phase-shift amplification is basically both a low pass and band pass technique, D.-C. or zero frequency amplification may be readily achieved by phase-shift amplifiers. One type of such phase-shift amplifier is described in my copending application Serial No. 66,888, filed November 3, 1960, and now abandoned. The phase-shift amplifier in Serial No. 66,888 utilizes a "solid state" varactor diode as the non-linear reactance element controlled by the input signal to be amplified. The application of such varactor diodes is limited by the fact that they usually have a certain cut-off frequency in the microwave region. As the signal frequency to be amplified increases toward the cut-off frequency, the gain of the amplifier decreases and the noise figure rises. This latter fact is due to the increase in the lossy resistive component of the varactor diode which is the largest source of noise and hence provides the largest contribution to the noise figure of the phase-shift amplifiers.

It is an object of the present invention to provide an improved phase-shift amplifier wherein the above limitations are overcome.

It is another object of the present invention to provide an improved phase-shift amplifier for microwave input signals wherein the necessity for a varactor diode is completely eliminated.

In brief, the phase-shift amplifier includes a hybrid magic-tee having a series arm, a shunt arm and two branch arms having a common junction. The branch arms are terminated by respective shorting plates, and one of the branch arms comprises a ridged waveguide section between its respective short and the common junction. Included further is a microwave pump signal which is fed to the shunt arm and means responsive to the input signal to be amplified for producing across the ridge of the ridged waveguide section a fast cyclotron mode electron beam modulated in accordance with the input signal to be amplified. The fast cyclotron wave modulated signal interacts with the pump signal field at the ridge such that the reflected pump wave energy in the ridged waveguide branch arm is shifted in phase in proportion to the magnitude of the input signal to be amplified. The reflected unmodulated pump signal wave in the other branch arm is additively combined with the phase modulated pump signal wave in the series arm of the magic-tee. In addition, there is included a detector terminating the series arm for producing the amplified reproduction of the input signal.

Figure 2:
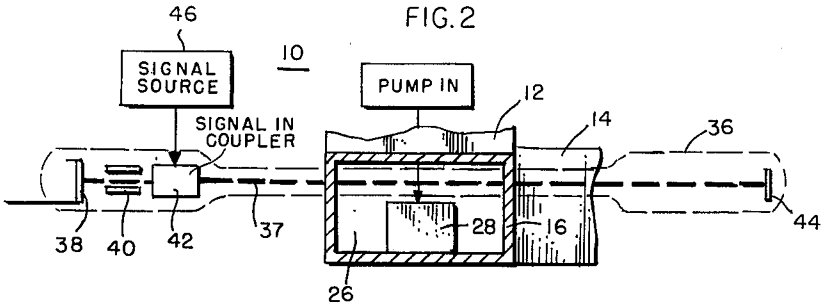

For a better understanding of the invention, together with other and further objects thereof, reference is had to the following description taken in connection with the accompanying drawing in which:

FIG. 1 illustrates a preferred embodiment of the invention partially in perspective and partially schematic; and FIG. 2 is a sectional view taken along the lines 2—2 of FIG. 1.

Referring now to FIGS. 1 and 2 of the drawing, there is shown a waveguide hybrid network or magic-tee 10 having arms or branches 12, 14, 16 and 18, to which appropriate connections are made. Arms 12 and 14, and 16 and 18, respectively, constitute pairs of conjugate arms of the waveguide hybrid and are all joined together at a common junction 20. The branch arms are further characterized by the fact that no energy may be transmitted directly from one arm of such a pair to the other arm of that pair and that the connections to the respective arms of such a conjugate pair may be interchanged without effect upon the performance of the circuit. For convenience, branch 12 will be referred to as the shunt or input arm; branch 14 will be referred to as a series or output arm; and branches 16 and 18 will be referred to as the side arms. As shown in FIG. 1, a pump oscillator 22, which may be any suitable microwave source, is connected to shunt arm 12 and provides a source of microwave energy which divides at junction 20 and is coupled to side arms 16 and 18. For proper operation the pump frequency should be at least five times higher than the input signal to be amplified. The side arms 16 and 18 are terminated by adjustable back plates or variable positioned short circuiting members 24 and 26. Side arm 16 includes a longitudinally positioned ridge 28, intermediate short 24 and junction 20 so that, in effect, side arm 18 may be considered a ridged waveguide section. As shown, the longitudinally positioned ridge 28 is tapered at both ends for purposes of impedance matching as is well known in the art. Output arm 14 is terminated by a suitable matched termination 30 and a conventional crystal detector 32. The output of detector 32 is supplied to a suitable utilization circuit or load (not shown).

An electron beam tube 36 is provided transversely through side arm 16 and arranged to provide a longitudinal electron beam 37 which passes transversely through side arm 16 slightly above but closely spaced to the exposed surface of ridge 28. The electron beam tube 36 includes the conventional cathode gun 38, focussing plates 40, and a signal input coupler 42 of a distributed type such as the Cuccia coupler, all external of side arm 16 and on one side thereof, and further includes a collector anode 44 external of side arm 16 on the other side thereof. A longitudinal magnetic field $H_c$ is provided in the usual manner to the electron beam 37 of tube 36 as indicated by the arrows in FIG. 1. With such an arrangement, the electron beam 37 parallel to the magnetic field $H_c$ is moving through the input coupler 42 with a D.-C. velocity $v_0$ before passing transversely through side arm 16 and across ridge 28 to collector plate 44. The input signal to be amplified, source 46, is applied across the input coupler 42 in the conventional manner to provide an alternating electric field which is transverse to the longitudinal magnetic field $H_c$ and the electron beam. The magnetic field $H_c$ is selected such that its magnitude corresponds to a "cyclotron" frequency in the vicinity of the frequency of the input signal applied from source 46 to input coupler 42. The cyclotron frequency is related to the axial magnetic field in accordance with the formula $f_c=2.794\times10^6\ H_c$ c.p.s., where $H_c$ is in gausses. With the arrangement hereinabove described, the input signal from source 46 is coupled onto the beam through the input coupler 42 in the form a fast cyclotron wave modulation and, as is well known, noise present on the beam in the fast cyclotron mode will be stripped off the beam. Thus, upon leaving the input coupler 42, the noise free beam modulated with the input signal from source 46 passes transversely through the side arm 16 across ridge 28 and is capacitively coupled thereto to react with the pump power as hereinbelow described.

In discussing the operation of the amplifier, it is to be assumed that the shorting plates 24 and 26 are initially so positioned that, without any input signal from source 46, the hybrid bridge 10 was unbalanced slightly allowing approximately one milliwatt to be incident in the detector 32. This small amount of unbalance was desirable in order to bias the detector 32 for maximum sensitivity. Under such conditions, most of the pump power reflected from the two side arms 16 and 18 was cancelled at the junction 20. At the ridge 28 there is a strong pump field $E_pe^{j\omega_pt}$. Now, with the input signal from source 46 applied to the fast cyclotron wave input coupler 42, the modulated noiseless beam is acted upon by the strong pump field $E_pe^{j\omega_pt}$. The electrons moving across the ridge 28 will induce RF currents in the ridge circuit and cause an electronic admittance of the form $$Y=A(\omega_p,\ \omega_s)e^{j(\omega_p+\omega_s)t}$$

In other words, with the fast cyclotron wave output connected across the ridge circuit including the pump field, the pump field capacitance will be varied at the input signal frequency in side arm 16, due to linear or nonlinear intensity modulation of the beam. Therefore, the phase of the reflected pump power will be controlled by the cyclotron modulation of the electron beam. Thus, the reflected pump power from side arm 16 of hybrid 10 is phase modulated, while that from the other side arm 18 is unmodulated. The hybrid 10 functions as an adding circuit, and the phase modulated pump power in side arm 16 which caused an additional unbalance in the hybrid bridge 10 at the input signal frequency was converted to an amplitude modulated wave at the pump frequency in output arm 14 which is detected by detector 32. In other words, a change in the varying capacitance provides the standing wave pattern. Power gain results, inasmuch as the variation in capacitance caused by the input signal required less power at the input signal frequency than the resultant power unbalance in the hybrid bridge 10.

While there has been described what is at present considered to be the preferred embodiment of this invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. A phase-shift amplifier for amplifying a microwave input signal comprising,
   - a hybrid waveguide including a series arm, a shunt arm and two branch arms having a common junction, said branch arms being terminated by short circuits,
   - a microwave pump signal fed to said shunt arm,
   - one of said branch arms comprising a ridged waveguide section between its respective short and said common junction,
   - means responsive to said input signal for producing across the ridge of said ridged waveguide section a fast cyclotron mode electron beam modulated in accordance with said input signal,
   - said fast cyclotron wave modulation interacting with the pump signal field at said ridge such that the reflected pump signal wave energy in said ridged waveguide branch arm is shifted in phase in proportion to the magnitude of said input signal,
   - the reflected unmodulated pump signal wave in the other branch arm being combined with said phase modulated pump signal wave in said series arm,
   - and a detector terminating said series arm.

2. A phase-shift amplifier for amplifying a microwave input signal comprising,
   - a hybrid magic-tee including a series arm, a shunt arm and two branch arms having a common junction, said branch arms being terminated by short circuits,
   - a microwave pump signal fed to said shunt arm,
   - one of said branch arms comprising a ridged waveguide section between its respective terminated short and said common junction,
   - means for passing an electron beam at a prescribed velocity transversely through said one branch arm above and spaced from the exposed surface of the ridge in said ridged waveguide section,
   - means in circuit with said electron beam and responsive to said input signal to be amplified for producing on said electron beam a fast cyclotron wave modulated in accordance with said input signal,
   - said modulated fast cyclotron wave interacting with the pump signal field at said ridge whereby the pump signal wave is shifted in phase in proportion to the magnitude of said input signal, the reflected phase modulated pump signal being combined with the reflected unmodulated pump frequency in said series arm,
   - and a detector terminating said series arm for producing an amplified reproduction of said input signal.

3. A phase-shift amplifier for amplifying a microwave input signal comprising,
   - a hybrid magic-tee including a series arm, a shunt arm and two branch arms having a common junction, said branch arms being terminated by short circuits,
   - one of said branch arms comprising a ridged waveguide section between its respective terminated short and said common junction,
   - an electron beam tube having its source external of said one branch arm on one side thereof, and a collector anode for intercepting the beam external of said one branch arm or the other side thereof,
   - the electron beam passing transversely through said one branch arm at a prescribed velocity above and spaced from the exposed surface of the ridge in said ridged waveguide section,
   - a fast cyclotron wave coupler in circuit with said beam and responsive to the input signal to be amplified for producing on said beam a fast cyclotron wave modulated in accordance with said input signal,
   - a microwave pump signal fed to said shunt arm,
   - said modulated fast cyclotron wave interacting with the pump signal field at said ridge whereby the pump wave is shifted in phase in proportion to the magnitude of said input signal, the reflected phase modulated pump frequency signal being combined with the reflected unmodulated pump frequency in said series arm,
   - and a detector terminating said series arm for producing an amplified reproduction of said input signal.

4. The phase-shift amplifier in accordance with claim 1 wherein the pump signal frequency is at least five times higher than the input signal.

5. The phase-shift amplifier in accordance with claim 2 wherein the fast cyclotron modulating means comprise a Cuccia type coupler, said input signal being applied to said Cuccia coupler.

6. The phase-shift amplifier in accordance with claim 5 wherein the pump signal frequency is at least five times higher than the input signal.

7. A phase-shift amplifier for amplifying an input microwave signal comprising,
   - a hybrid waveguide including a series arm, a shunt arm and a pair of branch arms having a common junction, a microwave pump signal fed to said shunt arm, respective shorting plates for said branch arms, one of said branch arms comprising a ridged waveguide section intermediate said junction and a respective shorting plate, a detector terminating said series arm, said pump microwave signal being reflected from said shorting plates and additively combined in said series arm, an electron beam forming means responsive to said input signals for producing on said electron beam a fast cyclotron wave modulated in accordance with said input signal, said modulated fast cyclotron wave passing transversely through said one branch arm in coupling relationship to the pump signal field in said ridge waveguide such that the standing wave pattern of the reflected pump signal is shifted in phase in accordance with the magnitude of said input signal, the residual power between said modulated phase-shifted pump signal and the unmodulated pump signal being passed through said series arm to said detector.

8. The phase-shift amplifier in accordance with claim 7 wherein the fast cyclotron modulated wave is generated external of said ridged waveguide section.

9. The phase-shift amplifier in accordance with claim 7 wherein said electron beam means comprises a tube having an electron source on one side of said one branch arm, a Cuccia type coupler responsive to said input signal adjacent said electron source, a magnetic field parallel to said beam, and a collector anode on the other side of said one branch arm, said modulated fast cyclotron beam passing transversely through said one branch arm above and spaced from the exposed surface of the ridge in said ridged waveguide section.

No references cited.

ROY LAKE, *Primary Examiner.*

D. HOSTETTER, *Assistant Examiner.*